United States Patent
Valsan et al.

(10) Patent No.: US 12,292,466 B2
(45) Date of Patent: May 6, 2025

(54) METHOD AND SYSTEM FOR DETECTING LOCATION OF FAULT IN A CABLE

(71) Applicant: ABB Schweiz AG, Baden (CH)

(72) Inventors: Simi Valsan, Ernakulam (IN); Apala Ray, Bangalore (IN); Ketan Kulkarni, Belagavi (IN); Arinjai Gupta, Bangalore (IN)

(73) Assignee: ABB Schweiz AG, Baden (CH)

( * ) Notice: Subject to any disclaimer, the term of this patent is extended or adjusted under 35 U.S.C. 154(b) by 84 days.

(21) Appl. No.: 18/450,592

(22) Filed: Aug. 16, 2023

(65) Prior Publication Data

US 2023/0400499 A1 Dec. 14, 2023

Related U.S. Application Data

(63) Continuation of application No. PCT/IB2021/051295, filed on Feb. 16, 2021.

(51) Int. Cl.
*G01R 31/08* (2020.01)
*H02H 3/28* (2006.01)

(52) U.S. Cl.
CPC ............ *G01R 31/086* (2013.01); *H02H 3/28* (2013.01)

(58) Field of Classification Search
USPC ........................................................ 324/522
See application file for complete search history.

(56) References Cited

U.S. PATENT DOCUMENTS

| 2012/0068717 A1* | 3/2012 | Gong | H02H 7/261 |
| | | | 324/522 |
| 2017/0199237 A1 | 7/2017 | Dzienis et al. | |

FOREIGN PATENT DOCUMENTS

WO    WO 2020/107041 A1    5/2020

OTHER PUBLICATIONS

European Patent Office, International Search Report in International Patent Application No. PCT/IB2021/051295, 5 pp. (Nov. 8, 2021).
European Patent Office, Written Opinion in International Patent Application No. PCT/IB2021/051295, 8 pp. (Nov. 8, 2021).

* cited by examiner

*Primary Examiner* — Farhana A Hoque
(74) *Attorney, Agent, or Firm* — Leydig, Voit & Mayer, Ltd.

(57) ABSTRACT

A system and method for detecting location of fault in a cable receives disturbance data from first and second protection relays when one of the first protection relay and/or the second protection relay detects a fault in a section of the cable. The system extracts voltage and current data for each segment in the section using the disturbance data, cable parameters and length of each segment, and determines a fitness value for each segment in the section using the extracted voltage and current data. The system identifies a segment with a lowest fitness value from the fitness value determined for each segment in the section by comparing the fitness value of each segment with the fitness value of subsequent segments in the section and detects the segment with the lowest fitness value as fault location in the cable.

14 Claims, 9 Drawing Sheets

METHOD AND SYSTEM FOR DETECTING LOCATION OF FAULT IN A CABLE

CROSS-REFERENCE TO RELATED APPLICATIONS

The instant application claims priority to International Patent Application No. PCT/IB2021/051295, filed Feb. 16, 2021, which is incorporated herein in its entirety by reference.

FIELD OF THE DISCLOSURE

The present disclosure generally relates to the field of power system protection and, more particularly, to the detection of location of fault in a cable.

BACKGROUND OF THE INVENTION

In recent times, there is a huge preference for underground cables for power transmission, especially in urban areas. Underground cables are suited for places where it is difficult to use overhead cables due to a variety of reasons. Unlike overhead cables, underground cables are less prone to environmental issues, are eco-friendly and provide good aesthetics. The continuous advances in cable performance have, also, helped in the widespread usage of underground cables. Some of the major hurdles in using the underground cables are (a) difficulty in locating and repairing faults, (b) accuracy of location of fault is not good enough, (c) expensive sensors/detectors needed to detect location of the fault, and (d) expensive excavations required at multiple places for fixing faults.

Typically, in densely populated/urban areas which are predominantly opting for underground cables, when a fault occurs in the underground cable and the accuracy of estimated location is not good enough, then trial and error-based excavations need to be carried out on both sides of the estimated location to expose the faulted part. In most cases, it will not be possible to dig over large areas or perform trial and error excavations. Furthermore, this approach causes lot of disruptions/discomfort to the population living in the vicinity of the estimated location. An alternative is to deploy expensive sensors and detectors along the path of the cable to pinpoint the location at which fault occurs. Because of the cost and time factors associated with these existing techniques, there is a need to estimate the faults more accurately to few meters, especially, for faults within the city center or urban areas. Furthermore, in many of the estimation techniques deployed currently, fault resistance plays a major role in determining accuracy of the location estimation of fault. Fault resistance in case of cables can vary over a wider range, for instance, phase to ground, phase to phase or three phase faults, which can, also, influence negatively in estimating the fault location.

BRIEF SUMMARY OF THE INVENTION

In an embodiment, the present disclosure describes systems and methods for fault locating and detecting location of fault in a cable of an electrical power system. The cable comprises a plurality of sections, wherein one end of each of the plurality of sections is connected with a first protection relay and other end of each of the plurality of sections is connected with a second protection relay. Each of the plurality of sections further comprises one or more segments.

In one embodiment, the system comprises a processor and a memory communicatively coupled to the processor. The memory stores processor-executable instructions, which on execution, cause the processor to receive disturbance data from the first protection relay and the second protection relay when at least one of the first protection relay and the second protection relay detect fault in a section of the cable. In the next step, the processor is configured to extract voltage and current data for each segment in the section of the cable using the disturbance data, cable parameters and length of each segment.

Subsequently, the processor is configured to determine a fitness value for each segment in the section of the cable using the voltage and current data extracted for each segment in the section of the cable. The fitness value may be based on a square of difference between the extracted voltage and current data of each segment associated with the first protection relay and the extracted voltage and current data of each segment associated with the second protection relay. Thereafter, the processor is configured to identify a segment with a lowest fitness value from the fitness value determined for each segment in the section of the cable by comparing the fitness value of each segment in the section with the fitness value of subsequent segments in the section and detect the segment with the lowest fitness value as location of the fault in the cable.

DETAILED DESCRIPTION OF THE INVENTION

Figure 1A:
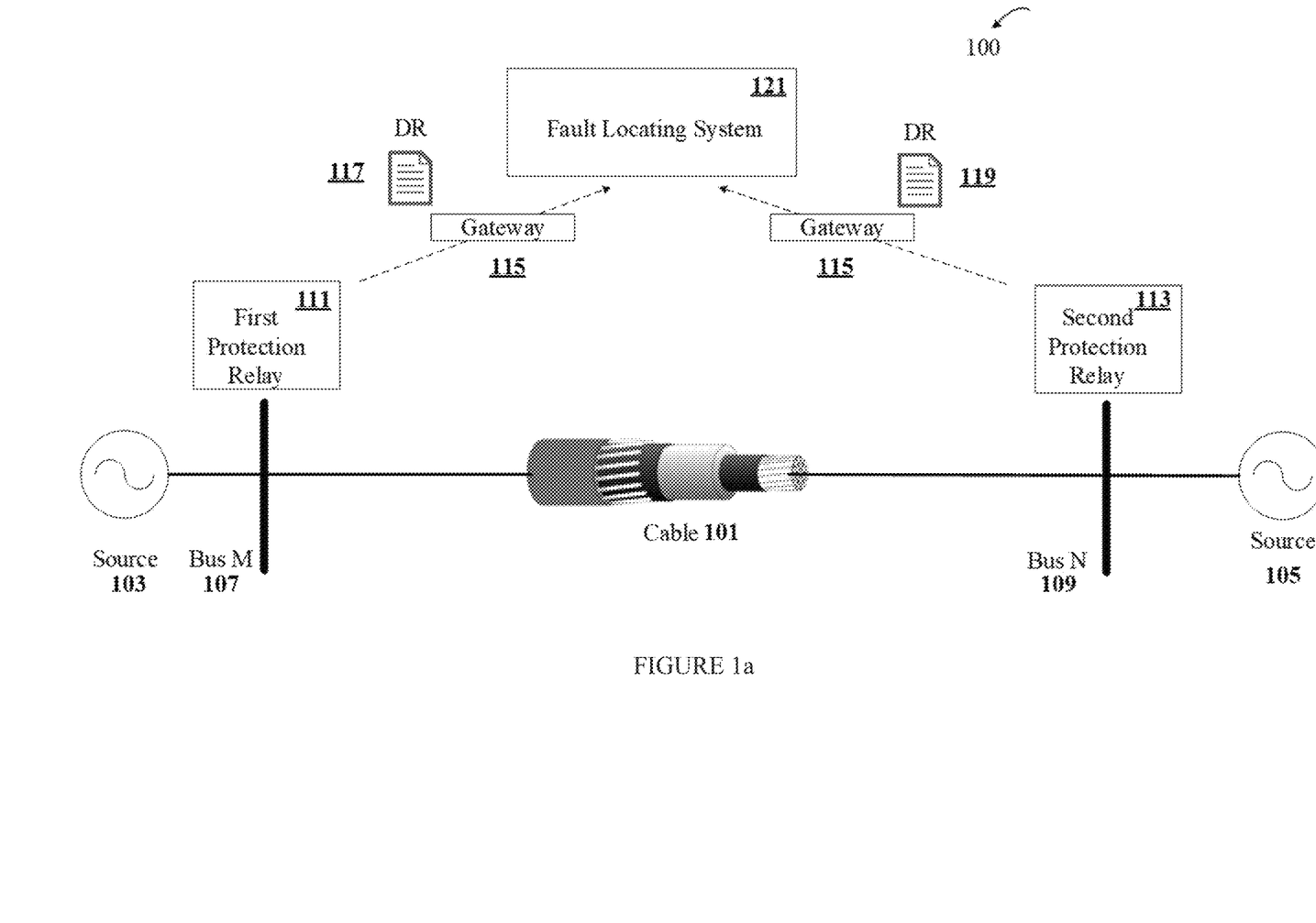
FIG. 1a shows an environment for detecting location of fault in a cable of an electrical power system in accordance with an embodiment of the disclosure.

FIG. 1a shows an environment for detecting location of fault in a cable of an electrical power system in accordance with an embodiment of the disclosure.

As shown in the FIG. 1a, the environment 100 includes a cable 101 of an electrical power system, a plurality of sources comprises a source 103 and a source 105, a plurality of buses comprises a bus M 107 and a bus N 109, a plurality of protection relays comprises a first protection relay 111 and a second protection relay 113 and a fault locating system 121. The cable 101 may be an underground cable or an overhead cable. In one embodiment, the protection relays may be replaced by numerical relays. The plurality of sources may be electrical devices, for example voltage and current transformers. One end of the cable 101 is connected to the source 103 and other end of the cable 101 is connected to the source 105. In one embodiment, the source 105 may be replaced by a load (not shown in FIG. 1a). The cable 101 may comprise a plurality of sections (not shown in FIG. 1a), wherein one end of each of the plurality of sections is connected with the first protection relay 111 through the bus M 107 and other end of each of the plurality of sections is connected with the second protection relay 113 through the bus N 109. As an example, and for the purpose of illustration, one section of the cable 101 is considered in FIG. 1a and should not be considered as limitation of the invention. In one embodiment, the first protection relay 111 and the second protection relay 113 may be implemented with an inter-tripping scheme. An inter-tripping scheme is a scheme where both relays (the first protection relay 111 and the second protection relay 113) independently watch out for/detect faults and whichever relay detects the fault first communicates that fault information to the other relay. This approach ensures circuit breakers at the first protection relay 111 and the second protection relay 113 are tripped. The inter-tripping scheme, also, helps in case the fault is feeble towards one end of the relay and the relay at its other end fails to detect the fault.

During normal operation or fault free condition, voltage and current signals are received as an input by the first protection relay 111 from the source 103 through the bus M 107, and voltage and current signals are received as an input by the second protection relay 113 from the source 105 through the bus N 109. The first protection relay 111 and the second protection relay 113 continuously monitors the respective voltage and current signals till a fault (for example, over-current or under-voltage) is detected by either the first protection relay 111 or the second protection relay 113 or both. Once a fault is detected, for instance, by the first protection relay 111, the first protection relay 111 issues a trip signal to the second protection relay 113 to isolate the section of cable 101. A disturbance data containing voltage and current signals immediately prior to the fault and during the fault is created in the first protection relay 111 and the second protection relay 113.

As an example, the disturbance data may have *.cfg and/or *.dat COMTRADE files format. In one embodiment, the disturbance data may, also, contain voltage and current signals after tripping of the first protection relay 111 and the second protection relay 113. The disturbance data may, also, be referred as disturbance record (DR). The DR 117 created at the first protection relay 111 and the DR 119 created at the second protection relay 113 are transmitted to the fault locating system 121 through a gateway 115. The gateway 115 may be, but is not limited to, a direct interconnection, an e-commerce network, a Peer-to-Peer (P2P) network, Local Area Network (LAN), Wide Area Network (WAN), wireless network (for example, using Wireless Application Protocol), Internet, Wi-Fi, Bluetooth and the like. In one embodiment, the gateway 115 may be a secure gateway. The fault locating system 121 may be present in a central protection device or on a cloud infrastructure.

In one embodiment, the cable 101 may be made of different types of cable connected in series in accordance with an embodiment of the invention. For instance, as shown in the FIG. 1b, the cable 101 comprises of an underground cable $101_1$ and an overhead cable $101_2$ connected in series.

One end of the cable 101 is connected with the first protection relay 111 through the bus M 107 and also to the source 103. The other end of the cable 101 is connected with the second protection relay 113 through the bus N 109. In one embodiment, the first protection relay 111 and the second protection relay 113 may be implemented with an inter-tripping scheme. The cable 101 comprises a plurality of sections (not shown in FIG. 1b), wherein one end of each of the plurality of sections is connected with the first protection relay 111 through the bus M 107 and the other end of each of the plurality of sections is connected with the second protection relay 113 through the bus N 109.

Figure 1B:
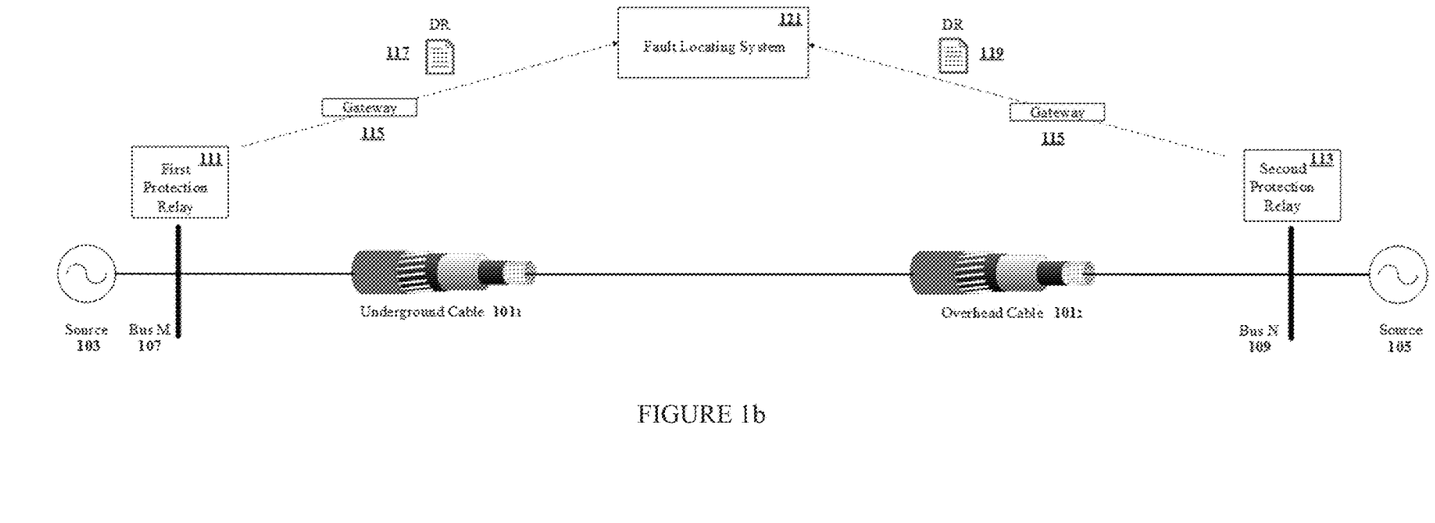
FIG. 1b shows an environment for detecting location of fault in different types of cable connected in series in accordance with an embodiment of the disclosure.

During normal operation or fault free condition, voltage and current signals are received as an input by the first protection relay 111 from the source 103 through the bus M 107, and voltage and current signals are received as an input by the second protection relay 113 from the source 105 through the bus N 109. The first protection relay 111 and the second protection relay 113 keep monitoring the voltage and current signals till a fault (for example, over-current or under-voltage) is detected by either the first protection relay 111, the second protection relay 113 or both. Once a fault is detected, for instance, by the second protection relay 113, the second protection relay 113 issues a trip signal to the first protection relay 111 to isolate the cable 101 which includes the underground cable $101_1$ and the overhead cable $101_2$.

A set of disturbance data containing voltage and current signals recorded immediately prior to the fault and during the fault is created in the first protection relay 111 and the second protection relay 113. As an example, the disturbance data may have *.cfg and/or *.dat COMTRADE files format. In one embodiment, the disturbance data may, also, contain voltage and current signals recorded after tripping of the first protection relay 111 and the second protection relay 113. Here, the disturbance data may be referred as disturbance record (DR). The DR 117 created at the first protection relay 111 and the DR 119 created at the second protection relay 113 are transmitted to the fault locating system 121 through the gateway 115. The gateway 115 may be, but is not limited to, a direct interconnection, an e-commerce network, a Peer-to-Peer (P2P) network, Local Area Network (LAN), Wide Area Network (WAN), wireless network (for example, using Wireless Application Protocol), Internet, Wi-Fi, Bluetooth and the like. The fault locating system 121 may be present in the central protection device or on cloud infrastructure.

Figure 2:
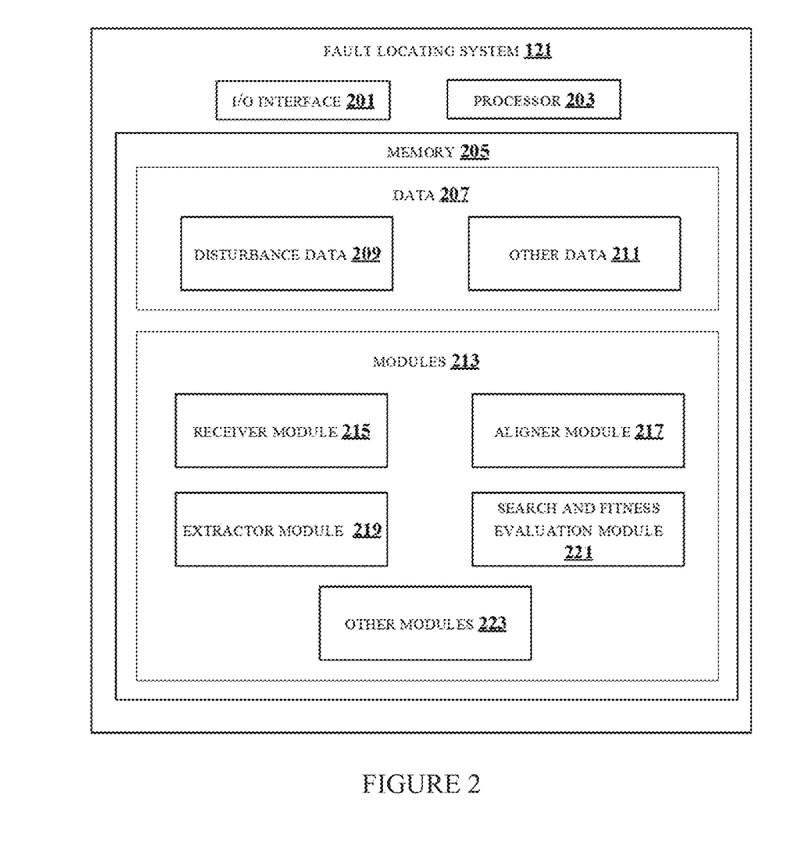
FIG. 2 is a block diagram of a fault locating system for detecting location of fault in a cable in accordance with an embodiment of the disclosure.

FIG. 2 is a block diagram of the fault locating system for detecting location of fault in a cable in accordance with an embodiment of the invention.

The fault locating system 121 includes an I/O interface 201, a processor 203, and a memory 205. The I/O interface 201 may be configured to receive the DR 117 and DR 119 from the first protection relay 111 and the second protection relay 113, respectively. The I/O interface 201 may employ wired or wireless communication protocols/methods.

The DR 117 and DR 119 received by the I/O interface 201 may be stored in the memory 205. The data 207 may include, for example, disturbance data 209 and other data 211. The DR 117 and DR 119 received from the first protection relay 111 and the second protection relay 113, respectively, are stored as the disturbance data 209. The DR 117 and DR 119 may contain voltage and current signals recorded immediately prior to the fault and during the fault. In one embodiment, the DR 117 and DR 119 may also, contain voltage and current signals recorded after tripping of the first protection relay 111 and the second protection relay 113. The other data 211 stores data, including temporary data and temporary files, generated by one or more modules 213 for performing the various functions of the fault locating system 121.

The memory 205 may be communicatively coupled to the processor 203 of the fault locating system 121. The memory 205 may, also, store processor instructions which can cause the processor 203 to execute the instructions for detecting location of fault in a cable. The memory 205 may include, without limitation, memory drives, removable disc drives, and the like. The memory drives may further include a drum, magnetic disc drive, magneto-optical drive, optical drive, Redundant Array of Independent Discs (RAID), solid-state memory devices, solid-state drives, and the like.

The processor 203 may include at least one data processor for detecting location of fault in a cable. The processor 203 may include specialized processing units such as integrated system (bus) controllers, memory management control units, floating point units, graphics processing units, digital signal processing units, and the like.

In one embodiment, the data 207 in the memory 205 is processed by the one or more modules 213 present within the memory 205 of the fault locating system 121. In the embodiment, the one or more modules 213 may be implemented as dedicated hardware units. As used herein, the term module refers to an Application Specific Integrated Circuit (ASIC), an electronic circuit, a Field-Programmable Gate Arrays (FPGA), Programmable System-on-Chip (PSoC), a combinational logic circuit, and/or other suitable components that provide the described functionality. In some implementations, the one or more modules 213 may be communicatively coupled to the processor 203 for performing one or more functions of the fault locating system 121. The said modules 213 when configured with the functionality defined in the present disclosure will result in a novel hardware.

In one implementation, the one or more modules 213 may include, but are not limited to, a receiver module 215, an aligner module 217, an extractor module 219, and a search and fitness evaluation module 221. The one or more modules 213 may, also, include other modules 223 to perform various miscellaneous functionalities of the fault locating system 121.

The operation of one or more modules 213 is explained with reference to the FIG. 1a.

Figure 3:
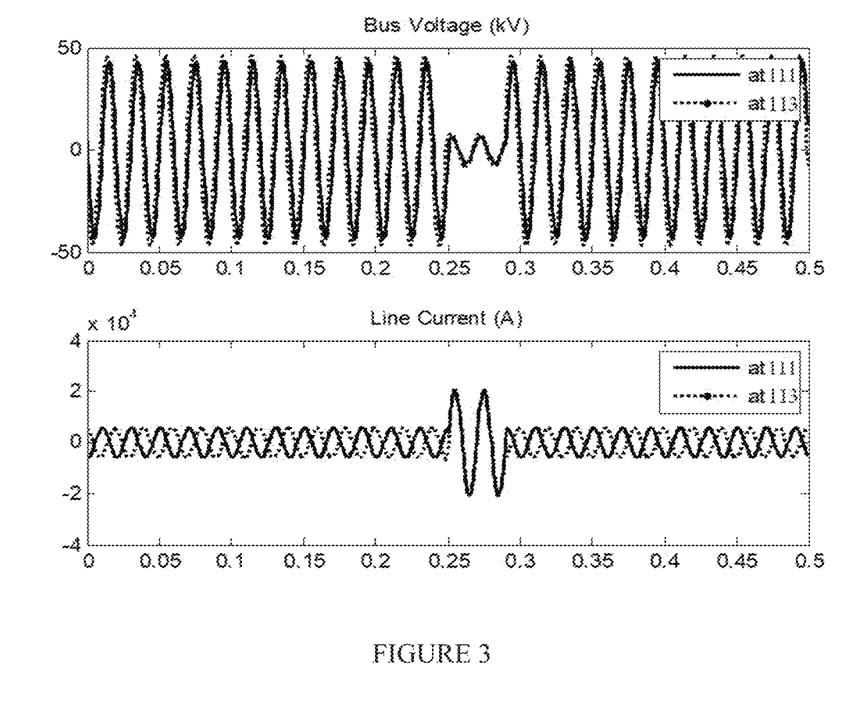
FIG. 3 represents disturbance data received by the fault locating system from a first protection relay and a second protection relay in accordance with an embodiment of the disclosure.

The receiver module 215 receives the DR 117 and DR 119 from the first protection relay 111 and the second protection relay 113 when one of the first protection relay 111 and the second protection relay 113 detect fault in the section between the first protection relay 111 and the second protection relay 113 of the cable 101. The DR 117 and DR 119 comprises at least one of voltage signal and current signal recorded by each of the first protection relay 111 and the second protection relay 113 prior to the fault in the section of the cable 101 and during the fault in the section of the cable 101. The DR comprising the at least one of voltage signal and current signal received by the receiver module 215 from the first protection relay 111 and the second protection relay 113 is shown in FIG. 3. The top plot of FIG. 3 represents (bus) voltage signal recorded by the first protection relay 111 and the second protection relay 113 with respect to time. The bottom plot of FIG. 3 represents (line) current signal recorded by the first protection relay 111 and the second protection relay 113 with respect to time. The voltage signal and current signal are recorded such that 50% of the signal refers to pre-fault data and 50% of the signal refers to post-fault data. The total time duration on x-axis may be 0.5 s or more.

Figure 4A:
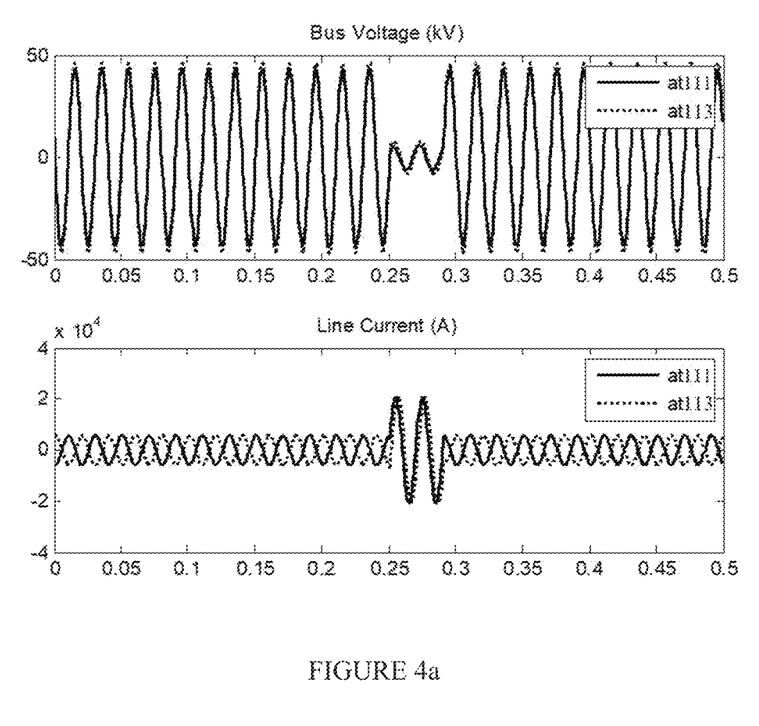
FIG. 4a is a representation of time-aligned disturbance data in accordance with an embodiment of the disclosure.

The aligner module 217, using the DR 117 and DR 119 from the receiver module 215, aligns the DR 117 of the first protection relay 111 and the DR 119 of the second protection relay 113 based on timestamp information of the DR 117 and DR 119. Timestamped disturbance data are obtained from time synchronized relays (first protection relay 111 and the second protection relay 113) at both ends of the cable 101, which are normally used for cable protection. The aligner module 217 retrieves/gets timestamp information from the DR 117 and the DR 119 as well as the total length of the record in terms of number of samples. Further, the aligner module 217 finds the difference in timestamps (also, referred as timestamp delay) and converts the DR 117 and DR 119 in terms of number of samples. Thereafter, the aligner module 217 aligns the DR 117 and DR 119 based on timestamp delay, as shown in FIG. 4a. The aligner module 217 allows disturbance data alignment to be done based on timestamp to overcome slight difference in the instant of disturbance data captured by the first protection relay 111 and the second protection relay 113 of the cable 101.

Figure 4B:
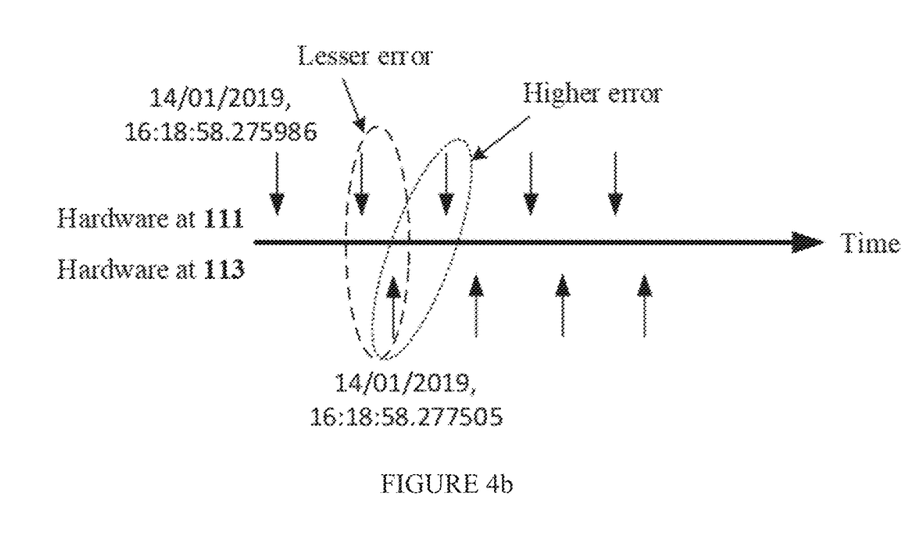
FIG. 4b shows a hardware alignment error between the first protection relay and the second protection relay in accordance with an embodiment of the disclosure.

In one embodiment, the aligner module 217 may correct the DR 117 and DR 119 received from the first protection relay 111 and the second protection relay 113 for any hardware alignment error between the first protection relay 111 and the second protection relay 113 using a linear interpolation technique. For instance, even after time aligning the DR 117 and DR 119 with respect to samples, there can be differences in exact instant of sampling in different hardware, in this scenario, the first protection relay 111 and the second protection relay 113, which may lead to error in estimation of fault location. The probability of error due to different hardware is explained with an example, as shown in FIG. 4b. Assuming the trigger point timestamp in DR at the first protection relay 111 is 14/01/2019,16:18:58.275986 and that at the second protection relay 113 is 14/01/2019, 16:18:58.277505, the difference in timestamps comes to −0.001519 s. This in terms of number of samples (assuming 1.6 kHz sampling frequency) comes to −2.4304~2 samples. Correcting for the two-sample difference by aligning the DR 117 and DR 119 will still leave an error of (−0.4304*625e-6=0.269 ms). The mismatch in sampling by different hardware, in this scenario, the first protection relay 111 and second protection relay 113 and the error levels due to the choice of the alignment point is shown in FIG. 4b. Depending on how much the sampling instants of the two hardware is off from each other and based on which side sample is used for alignment, the probability of error may vary. This error may be corrected using the linear interpolation technique. The DR 117 and DR 119 are first aligned based on samples choosing the nearest sample and then using linear interpolation, the sample value for the exact time instant is derived, thus, giving minimum possible error.

The extractor module 219 extracts voltage and current data for each segment in the section of the cable 101 using the DR 117 and DR 119, cable parameters and length of each segment. In detail, the extractor module 219 determines magnitudes and angles from the DR 117 and DR 119 received from the first protection relay 111 and the second protection relay 113, respectively, using a discrete Fourier transform technique. In next step, the extractor module 219 calculates at least one of series impedance and shunt admittance for each segment in the section between the first protection relay 111 and the second protection relay 113 of the cable 101 using the cable parameters associated with the cable 101 and length of each segment in the cable 101. The series impedance and shunt admittance for each segment in the section between the first protection relay 111 and the second protection relay 113 of the cable 101 are calculated as detailed below. The cable parameters associated with the cable 101 comprise at least one of positive sequence resistance (R1), positive sequence reactance (X1), positive sequence shunt susceptance (Xc1), zero sequence resistance (R0), zero sequence reactance (X0), zero sequence shunt susceptance (Xc0) per unit length and length of the cable 101.

For three phase systems, for the section between the first protection relay 111 and the second protection relay 113 of the cable 101, series impedance ($Z_{series}$) and shunt admittance ($Y_{shunt}$) matrices are given by:

$$Z_{series} = \begin{bmatrix} Rs+1i*Xs & Rm+1i*Xm & Rm+1i*Xm \\ Rm+1i*Xm & Rs+1i*Xs & Rm+1i*Xm \\ Rm+1i*Xm & Rm+1i*Xm & Rs+1i*Xs \end{bmatrix} \text{ where}$$

$$Rm = \frac{(R0-R1)}{3}, Rs = R1+Rm, Xm = \frac{(X0-X1)}{3} \text{ and } Xs = X1+Xm$$

$$Y_{shunt} = \begin{bmatrix} 1i*Ycs & 1i*Ycm & 1i*Ycm \\ 1i*Ycm & 1i*Ycs & 1i*Ycm \\ 1i*Ycm & 1i*Ycm & 1i*Ycs \end{bmatrix} \text{ where}$$

$$Ycm = \frac{1}{3}\left(\frac{1}{Xc0} - \frac{1}{Xc1}\right) \text{ and } Ycs = \frac{1}{Xc1} + Ycm$$

Converting to modal quantities as $$Z0 = T * Z_{series} * invT$$

$$Y0 = T * Y_{shunt} * invT \text{ where}$$

$$T = \frac{2}{3}\begin{bmatrix} 0.5 & 0.5 & 0.5 \\ 1 & -0.5 & -0.5 \\ 0 & \frac{\sqrt{3}}{2} & -\frac{\sqrt{3}}{2} \end{bmatrix} \text{ and } invT = \begin{bmatrix} 1 & 1 & 0 \\ 1 & -0.5 & \frac{\sqrt{3}}{2} \\ 0 & -0.5 & -\frac{\sqrt{3}}{2} \end{bmatrix}$$

In single phase system, $Z0 = Z_{series}$ and $Y0 = Y_{shunt}$

The above series impedance and shunt admittance calculations are for the entire section between the first protection relay 111 and the second protection relay 113 of cable 101.

To calculate series impedance and shunt admittance for each segment in the section between the first protection relay 111 and the second protection relay 113 of the cable 101, the section of the cable 101 is assumed to be divided into 100 equal segments. The number 100 mentioned here is for sake of explanation only and should not be considered as limiting to the scope of invention. However, in practice this may be any number. In one embodiment, the division of the section of the cable 101 may be of unequal segments. Length of each segment in the section of the cable 101 may then be calculated in meters as lseg=Ls/100, where Ls is the length of the section of the cable 101. Subsequently, series impedance and shunt admittance for each segment may be calculated as:

Z0_seg(s)=Z0(s)*lseg(s)

Y0_seg(s)=Y0(s)*lseg(s)

where section s is equal to 1.

In one embodiment, the cable 101 may have multiple sections wherein each section "s" may be further divided into multiple segments as described above. For each segment in the section of the cable 101, voltage and current data is extracted using the magnitudes and angles from the DR 117 and DR 119 and the at least one of series impedance and shunt admittance for that segment.

The search and fitness evaluation module 221 determines a fitness value for each segment in the section of the cable 101 using the voltage and current data extracted for each segment in the section of the cable 101. The fitness value is determined as following. At first, the search and fitness evaluation module 221 initializes minimum fitness value to a predetermined value. This predetermined value may be a very high value. In next step, the search and fitness evaluation module 221 updates voltage and current data for each segment starting from the ends of the first protection relay 111 and the second protection relay 113 towards the assumed fault location based on voltage drop along the segments using line impedance matrices. Let the voltage values at the assumed fault location calculated from the first protection relay 111 and the second protection relay 113 be V_M(s) and V_N(s) respectively. V_M(s) and V_N(s) gives the voltage at the nodes on either side of the segments. Thereafter, the search and fitness evaluation module 221 calculate fitness value for the assumed fault location as sum of square of absolute difference in voltages V_M(s) and V_N(s) and is given below:

fitVal=Σ|V_M(s)−V_N(s)|²

Subsequently, the search and fitness evaluation module 221 updates the minimum fitness value if the calculated value is less than the predetermined value. In doing so, the search and fitness evaluation module 221 identifies a segment with a lowest fitness value from the fitness value determined for each segment in the section of the cable 101 by comparing the fitness value of each segment in the section with the fitness value of subsequent segments in the section. Thereafter, the search and fitness evaluation module 221 detects the segment with the lowest fitness value as location of the fault in the cable 101. The steps mentioned above constitute first iteration, which gives an approximate location of fault in the cable 101. An example of this first iteration is shown in FIG. 5a.

Figure 5A:
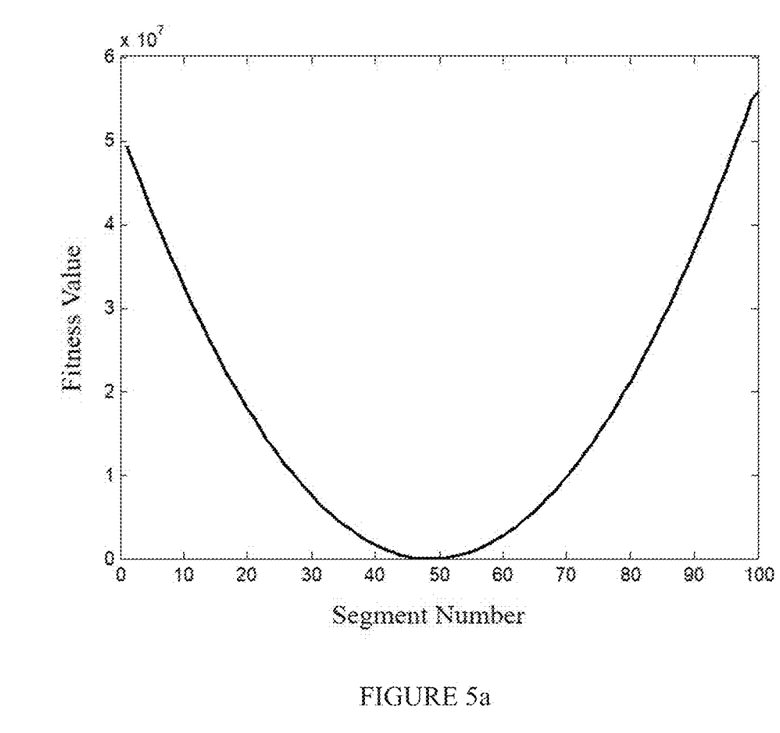
FIGS. 5a and 5b show graphical representations of an output of search and fitness evaluation technique for first and second iterations, respectively, in accordance with an embodiment of the disclosure.

In the example presented in FIG. 5a, the minimum fitness value corresponds to the segment 49. The fault may be anywhere on the segment 49 or at the end of segment 48. Hence complete segment 48 is considered in the next iteration. The length of segment 48 may be estimated as 48*39=1872 m where 39 is the segment length for first iteration (39=3900 m/100) and 3900 m is total length of section of the cable 101 between the first protection relay 111 and the second protection relay 113. For better accuracy in detecting the location of fault, it is required to further iterate over segment 48 and an adjacent segment subsequent to the segment with the lowest fitness value, in this scenario, segment 49. Hence, the segments 48 and 49 are chosen as the search area in next iteration by the search and fitness evaluation module 221. The location estimate after first iteration is hence fixed as 48*39=1872 m to which the results of further iteration will be added. At this stage, the search and fitness evaluation module 221 combines the adjacent segment 48 with the segment with the lowest fitness value 49 to form a new segment and compares length of a sub-segment in the new segment with a predefined threshold length. Here, the predefined threshold length may be set to any number.

If or when the sub-segment length is more than the predefined threshold length, the search and fitness evaluation module 221 repeats the steps mentioned above till the new segment (also, referred as sub-segment) length is less than the predefined threshold length. In this example, the segment length for first iteration is 39 m. If the predefined threshold length is set as 1 m, then the search and fitness evaluation module 221 repeats the iteration with segments 48 and 49. This is done to further accurately locate the fault within a new search area of 1872 m to 1950 m.

Figure 5B:
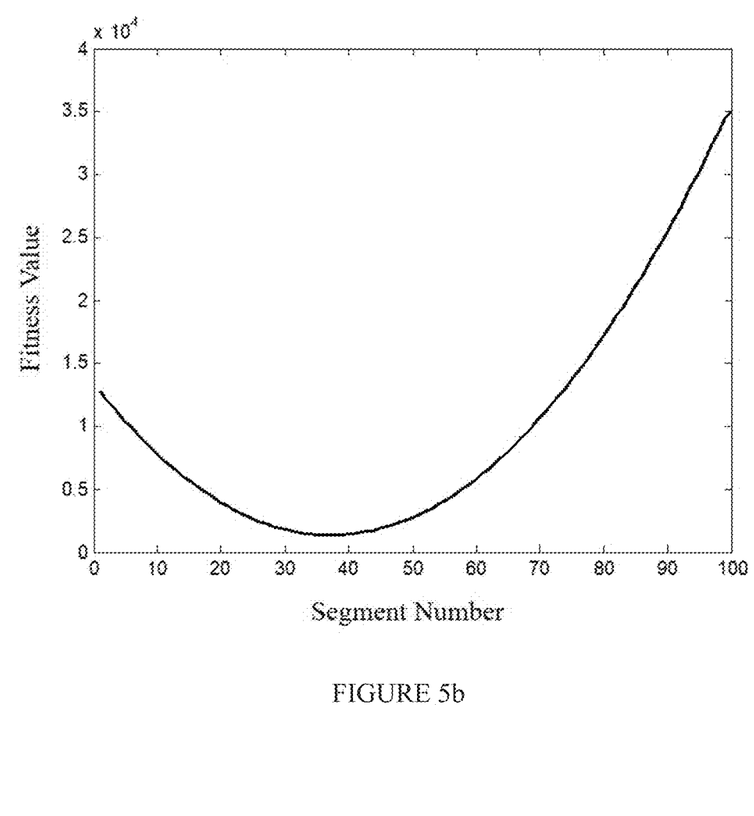

The new segment (sub-segment) length is 39*2/100=0.78 m. The fitness value at the end of second iteration is shown in FIG. 5b. It is seen that minimum value corresponds to new segment 37. The actual location may be anywhere on new segment 37 or at the at the end of segment 36. Hence, the complete segment 36 is taken for location estimation, which means the additional length to be added to the starting point of this second iteration is 36*0.78=28.08 m, giving the fault location as 1872+28.08=1900.1 m. Due to the optimal way in which segmentation (segments are created) is done, the search and fitness evaluation module 221 reaches the predefined threshold length within two or three iterations. For example, for a 200 km line, the segment length for first iteration is 200000/100=2000 m. For second iteration, the segment length is 2000*2/100=40 m and for third iteration, the segment length becomes 40*2/100=0.8 m, which then meets the predefined threshold length of 1 m.

Locating fault towards the ends of the cable 101 may have more error whereas locating fault at the center of the cable 101 may be more accurate. Hence, in one embodiment, a weighting/correction factor may be applied based on the estimated fault location value to improve the overall accuracy. This may be done using simulation or historical data. For example, when a simulation model of the cable system including cable and protection relays is available, faults may be simulated near the ends of a cable and thereafter, based on the error observed, a weighting factor can be calculated. The error is basically caused by the modelling of cable (using pi model/T model/L model) used in the algorithm and get accumulated towards the ends.

Figure 6:
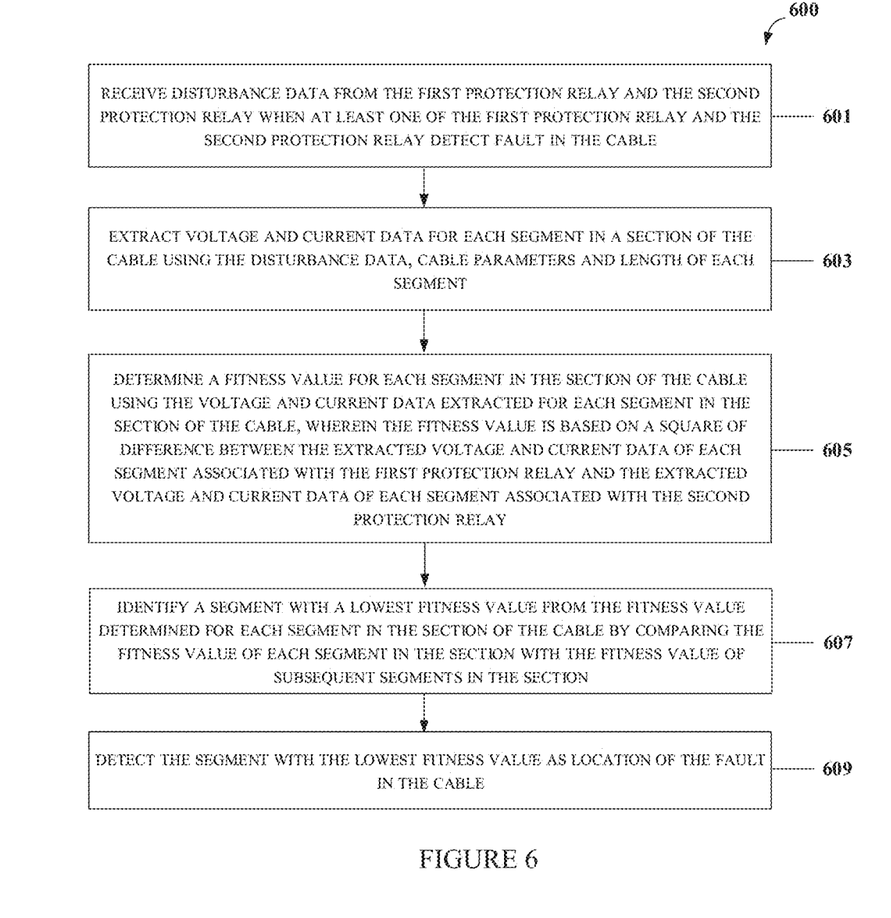
FIG. 6 is a flowchart of a method for detecting location of fault in a cable of an electrical power system in accordance with an embodiment of the disclosure.

FIG. 6 is a flowchart of a method for detecting location of fault in a cable of an electrical power system in accordance with an embodiment of the invention. Various steps of the method may be performed by the fault locating system 121 and can be carried out in a different order that what is shown here.

At step (601), the receiver module 215 of the fault locating system 121 receives disturbance data 117, 119 from the first protection relay 111 and the second protection relay 113. The disturbance data 117, 119 is received when at least one of the first protection relay 111 and the second protection relay 113 detect fault in the cable 101. Here, the disturbance data 117, 119 comprises at least one of voltage signal and current signal recorded by each of the first protection relay 111 and the second protection relay 113 prior to the fault in a section of the cable 101 and during the fault in the section of the cable 101.

At step (603), the extractor module 219 of the fault locating system 121 extracts voltage and current data for each segment in the section of the cable 101 using the disturbance data 117, 119, cable parameters and length of each segment. The cable parameters comprise at least one of positive sequence resistance, positive sequence reactance, positive sequence shunt susceptance, zero sequence resistance, zero sequence reactance, zero sequence shunt susceptance per unit length and length of the cable.

For extracting voltage and current data for each segment, the extractor module 219 first determines magnitudes and angles from the disturbance data 117, 119 received from the first protection relay 111 and the second protection relay 113 using a discrete Fourier transform technique. In next step, the extractor module 219 calculates at least one of series impedance and shunt admittance for each segment in the section of the cable 101 using the cable parameters associated with the cable 101 and length of each segment in the cable 101. Thereafter, the extractor module 219 extracts the voltage and current data for each segment in the section of the cable 101 using the magnitudes and angles from the disturbance data 117, 119 and the at least one of series impedance and shunt admittance for each segment in the section of the cable 101.

At step (605), the search and fitness evaluation module 221 of the fault locating system 121 determines a fitness value for each segment in the section of the cable 101 using the voltage and current data extracted for each segment in the section of the cable 101. The fitness value is based on a square of difference between the extracted voltage and current data of each segment associated with the first protection relay 111 and the extracted voltage and current data of each segment associated with the second protection relay 113.

At step (607), the search and fitness evaluation module 221 of the fault locating system 121 identifies a segment with a lowest fitness value from the fitness value determined for each segment in the section of the cable 101 by comparing the fitness value of each segment in the section with the fitness value of subsequent segments in the section.

At step (609), the search and fitness evaluation module 221 of the fault locating system 121 detects the segment with the lowest fitness value as location of the fault in the cable 101.

Further, the search and fitness evaluation module 221 selects an adjacent segment subsequent to the segment with the lowest fitness value and combines the adjacent segment with the segment with the lowest fitness value to form a new segment. Thereafter, the search and fitness evaluation module 221 compares length of a sub-segment in the new segment with a predefined threshold length and iteratively performs steps (603) to (609) until length of the sub-segment is within the predefined threshold length.

In an embodiment, the present disclosure employs a search and fitness evaluation technique that allows identifying location of cable faults quickly and with high accuracy using current and voltage transformers, which are normally installed for the protection of the cable. As a result, this approach overcomes need for any costly sensors/special sensors or any additional infrastructure. Due to high accuracy of the present method in identifying location of cable faults, multiple excavations at fault sites are avoided, resulting in minimum disruptions/discomfort to the population living in the vicinity of the estimated location. The search and fitness evaluation technique of present disclosure uses existing relay setup used for cable protection along with standard cable parameters. As a result, this approach is immune to fault resistance values in cable systems. The present disclosure works for both three-phase and single-phase systems and also, for different types of cable connected in series, for example, underground cable and overhead cable systems connected in series, as shown in FIG. 1b, with high accuracy of detecting location of cable fault. The fault locating system of the present disclosure can be easily deployed in central protection device or on cloud infrastructure.

Due to the search and fitness evaluation technique of the fault locating system, the present disclosure offers a solution that is fast and accurate in detecting location of cable fault.

This written description uses examples to describe the subject matter herein, including the best mode, and also to enable any person skilled in the art to make and use the subject matter. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

In some embodiments, the processor is configured to select an adjacent segment subsequent to the segment with the lowest fitness value and to combine the adjacent segment with the segment with the lowest fitness value to form a new segment. In subsequent step, the processor is configured to compare length of a sub-segment in the new segment with a predefined threshold length, and to iteratively perform steps mentioned for identifying a segment with a lowest fitness value until length of the sub-segment is within the predefined threshold length.

In an embodiment, the disturbance data comprises at least one of voltage signal and current signal recorded by each of the first protection relay and the second protection relay prior to the fault in the section of the cable and during the fault in the section of the cable.

In an embodiment, the processor is configured to align the disturbance data from the first protection relay and the second protection relay based on timestamp information of the disturbance data. Additionally, the processor is configured to correct the disturbance data from the first protection relay and the second protection relay for any hardware alignment error between them using a linear interpolation technique.

In an embodiment, the cable parameters comprise at least one of positive sequence resistance, positive sequence reactance, positive sequence shunt susceptance, zero sequence resistance, zero sequence reactance, zero sequence shunt susceptance per unit length and length of the cable.

Further, to extract voltage and current data for each segment in the section of the cable using the disturbance data, cable parameters and length of each segment, the processor is configured to determine magnitudes and angles from the disturbance data received from the first protection relay and the second protection relay using a discrete Fourier transform technique. Subsequently, the processor is configured to calculate at least one of series impedance and shunt admittance for each segment in the section of the cable using the cable parameters associated with the cable and length of each segment in the cable. Thereafter, the processor is configured to extract the voltage and current data for each segment in the section of the cable using the magnitudes and angles from the disturbance data and the at least one of series impedance and shunt admittance for each segment in the section of the cable.

Systems of varying scope are described herein. In addition to the aspects and advantages described in this summary, further aspects and advantages will become apparent by reference to the drawings and with reference to the detailed description that follows.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method for detecting location of fault in a cable of an electrical power system, wherein the cable comprises a plurality of sections, wherein one end of each of the plurality of sections is connected with a first protection relay and other end of each of the plurality of sections is connected with a second protection relay, and wherein each of the plurality of sections comprises one or more segments, the method comprising:

receiving, by a fault locating system, disturbance data from the first protection relay and the second protection relay when at least one of the first protection relay and the second protection relay detects a fault in the cable;

extracting, by the fault locating system, voltage and current data for each segment in a section of the cable using the disturbance data, cable parameters and length of each segment;

determining, by the fault locating system, a fitness value for each segment in the section of the cable using the voltage and current data extracted for each segment in the section of the cable, wherein the fitness value is based on a square of difference between the extracted voltage and current data of each segment associated with the first protection relay and the extracted voltage and current data of each segment associated with the second protection relay;

identifying, by the fault locating system, a segment with a lowest fitness value from the fitness value determined for each segment in the section of the cable by comparing the fitness value of each segment in the section with the fitness value of subsequent segments in the section; and detecting, by the fault locating system, the segment with the lowest fitness value as location of the fault in the cable.

2. The method of claim 1, wherein the disturbance data comprises at least one of voltage signal and current signal recorded by each of the first protection relay and the second protection relay prior to the fault in the section of the cable and during the fault in the section of the cable.

3. The method of claim 1, further comprising aligning, by the fault locating system, the disturbance data from the first protection relay and the second protection relay based on timestamp information of the disturbance data.

4. The method of claim 1, further comprising correcting, by the fault locating system, the disturbance data from the first protection relay and the second protection relay for determining a hardware alignment error using a linear interpolation technique.

5. The method of claim 1, wherein extracting the voltage and current data for each segment in the section of the cable comprises:
- determining, by the fault locating system, magnitudes and angles from the disturbance data received from the first protection relay and the second protection relay using a discrete Fourier transform technique;
- calculating, by the fault locating system, at least one of series impedance and shunt admittance for each segment in the section of the cable using the cable parameters associated with the cable and length of each segment in the cable; and
- extracting, by the fault locating system, the voltage and current data for each segment in the section of the cable using the magnitudes and angles from the disturbance data and the at least one of series impedance and shunt admittance for each segment in the section of the cable.

6. The method of claim 1, wherein the cable parameters comprise at least one of a positive sequence resistance, a positive sequence reactance, a positive sequence shunt susceptance, a zero sequence resistance, a zero sequence reactance, and a zero sequence shunt susceptance, per unit length and length of the cable.

7. The method of claim 1, further comprising:
- selecting, by the fault locating system, an adjacent segment subsequent to the segment with the lowest fitness value;
- combining, by the fault locating system, the adjacent segment with the segment with the lowest fitness value to form a new segment;
- comparing, by the fault locating system, a length of a sub-segment in the new segment with a predefined threshold length; and
- iteratively performing, by the fault locating system, the steps until the length of the sub-segment is within the predefined threshold length.

8. A fault locating system for detecting location of fault in a cable, wherein the cable comprises a plurality of sections, wherein one end of each of the plurality of sections is connected with a first protection relay and an other end of each of the plurality of sections is connected with a second protection relay, and wherein each of the plurality of sections comprises one or more segments, the system comprising:
- a processor; and
- a memory communicatively coupled to the processor, wherein the memory stores processor-executable instructions, which on execution, cause the processor to:
  - receive disturbance data from the first protection relay and the second protection relay when at least one of the first protection relay and the second protection relay detects fault in the cable;
  - extract voltage and current data for each segment in a section of the cable using the disturbance data, cable parameters and length of each segment;
  - determine a fitness value for each segment in the section of the cable using the voltage and current data extracted for each segment in the section of the cable, wherein the fitness value is based on a square of difference between the extracted voltage and current data of each segment associated with the first protection relay and the extracted voltage and current data of each segment associated with the second protection relay;
  - identify a segment with a lowest fitness value from the fitness value determined for each segment in the section of the cable by comparing the fitness value of each segment in the section with the fitness value of subsequent segments in the section; and
  - detect the segment with the lowest fitness value as location of the fault in the cable.

9. The fault locating system of claim 8, wherein the disturbance data comprises at least one of voltage signal and current signal recorded by each of the first protection relay and the second protection relay prior to the fault in the section of the cable and during the fault in the section of the cable.

10. The fault locating system of claim 8, wherein the processor is further configured to align the disturbance data from the first protection relay and the second protection relay based on timestamp information of the disturbance data.

11. The fault locating system of claim 8, wherein the processor is further configured to correct the disturbance data from the first protection relay and the second protection relay for hardware alignment error using a linear interpolation technique.

12. The fault locating system of claim 8, wherein the processor is further configured to:
- determine magnitudes and angles from the disturbance data received from the first protection relay and the second protection relay using a discrete Fourier transform technique;
- calculate at least one of series impedance and shunt admittance for each segment in the section of the cable using the cable parameters associated with the cable and length of each segment in the cable; and
- extract the voltage and current data for each segment in the section of the cable using the magnitudes and angles from the disturbance data and the at least one of series impedance and shunt admittance for each segment in the section of the cable.

13. The fault locating system of claim 8, wherein the cable parameters comprise at least one of a positive sequence resistance, a positive sequence reactance, a positive sequence shunt susceptance, a zero sequence resistance, a zero sequence reactance, and a zero sequence shunt susceptance, per unit length and length of the cable.

14. The fault locating system of claim 8, wherein the processor is further configured to:
   select an adjacent segment subsequent to the segment with the lowest fitness value;
   combine the adjacent segment with the segment with the lowest fitness value to form a new segment;
   compare length of a sub-segment in the new segment with a predefined threshold length; and
   iteratively perform the steps until length of the sub-segment is within the predefined threshold length.

* * * * *